United States Patent [19]

Brown, Jr. et al.

[11] Patent Number: 4,583,488
[45] Date of Patent: Apr. 22, 1986

[54] VARIABLE AXIS ROTARY DRIVE VACUUM DEPOSITION SYSTEM

[75] Inventors: William W. Brown, Jr., Milton; Wayne J. Curry, Montgomery, both of N.Y.; Gerhard P. Dahlke, Buxtehude, Fed. Rep. of Germany; Francis T. Lupul, LaGrangeville; Paul A. Totta, Poughkeepsie, both of N.Y.

[73] Assignee: International Business Machines Corporation, Armonk, N.Y.

[21] Appl. No.: 592,964

[22] Filed: Mar. 23, 1984

[51] Int. Cl.$^4$ .................................. B05C 13/00
[52] U.S. Cl. ........................ 118/500; 118/729; 118/730; 118/733; 269/57
[58] Field of Search ........ 118/730, 729, 733, 726, 118/500, 50, 719; 269/57; 74/17.8, 18

[56] References Cited

U.S. PATENT DOCUMENTS

| | | | |
|---|---|---|---|
| 2,351,537 | 6/1944 | Osterberg et al. | 91/12.2 |
| 3,110,620 | 11/1963 | Bertelsen | 118/730 X |
| 3,131,917 | 5/1964 | Gessner et al. | 118/500 X |
| 3,645,229 | 2/1972 | Phinney | 118/500 X |
| 3,746,571 | 7/1973 | Little, Jr. | 117/105.4 |
| 3,858,547 | 1/1975 | Bergfelt | 118/730 |
| 3,889,632 | 6/1975 | Brunner et al. | 118/49.1 |
| 4,002,141 | 1/1977 | Shrader | 118/730 |
| 4,036,171 | 7/1977 | Ramet | 118/49.1 |
| 4,226,208 | 10/1980 | Nishida et al. | 118/730 X |
| 4,310,614 | 1/1982 | Connell et al. | 430/271 |
| 4,380,212 | 4/1983 | Kraus | 118/730 X |

FOREIGN PATENT DOCUMENTS 1369713  7/1964  France ........................ 118/730

OTHER PUBLICATIONS

Moskowitz et al., "Non-Wearing Ferrofluidic Seals", SAE Prepr. #750851, Sep. 8–11, 1975.

Primary Examiner—Bernard F. Plantz
Attorney, Agent, or Firm—Barbara A. McDowell; Jessie L. Abzug; John A. Jordan

[57] ABSTRACT

Apparatus in a vacuum deposition system positions a workpiece holder in substantial alignment with a source of material to be deposited onto a work piece affixed to the workpiece holder. The apparatus also rotates the workpiece holder about the deposition source and linearly drives the workpiece holder to varying distances from the deposition source. The apparatus used to drive the workpiece holder is sealably mounted atop an opening in the vacuum chamber. The apparatus enables multiple source depositions to be carried out consecutively without accessing the vacuum chamber. By aligning the workpiece holder over the deposition source, nonuniform deposition onto the workpiece is substantially eliminated.

19 Claims, 2 Drawing Figures

VARIABLE AXIS ROTARY DRIVE VACUUM DEPOSITION SYSTEM

DESCRIPTION

1. Technical Field

This invention relates to an apparatus for vacuum depositing a layer of material on a workpiece and more particularly to an apparatus for optimally aligning the workpiece over the source of material to be deposited.

2. Background Art

Vacuum coating of a layer of material on a workpiece from a suitable source is used for a variety of applications. For example, vacuum deposition is used for coating optical lenses, in the manufacture of magnetic heads, and in the manufacture of integrated circuits and other similar devices. The deposition of electrically conductive metal and dielectric films on semiconductor wafers during semiconductor device fabrication is particularly extensively used. During the coating process, the semiconductor wafers are held in a wafer dome which is rotated as the evaporated source material is deposited on the substrate of the semiconductor wafers. The rotation of the wafer dome during deposition improves the uniformity of the thickness of the deposition over the entire batch of semiconductor wafers.

However, as semiconductor wafers increase in diameter and as deposition systems increase in size, the tendency for nonuniform thickness deposition across a batch of semiconductor wafers increases. Vacuum deposition systems being built today typically contain a plurality of source materials positioned at various locations within a vacuum chamber. As a result, the wafer dome is not always centered over the material source being deposited onto the batch of wafers, thus contributing to nonuniform thickness deposition. The nonuniform deposition problem is particularly acute at the edges of the wafers and in vias across the wafers. Ideally, it would be desirable to locate the center of the wafer dome directly over the center of the source of material being evaporated. Such a positioning would result in a deposition angle of incidence on the wafers approximately equal to 0°. As the angle of incidence onto the wafers increases, the nonuniformity problem worsens. The deposition angle of incidence is defined as the angular difference between a line extending from the center of the source to the center of the wafer dome and a line extending from the center of the source perpendicular to a line tangent to the center of the wafer dome.

In a multiple source deposition system, it is not uncommon to evaporate widely dissimilar materials such as, for example, Pb/SN, Cr, MGO, and Si. These dissimilar source materials have different evaporation rates, thus requiring the distance from the source being evaporated to the semiconductor wafers to vary according to the source material being evaporated. As a result, it is necessary to be able to not only center the wafer dome over the source being evaporated but also to be able to change the distance between the wafer dome and the source being evaporated.

Conventional vacuum deposition systems provide linear and rotational movement of a substrate holder such as a wafer dome. That is, they allow the wafer dome to be rotated about the evaporation source and they allow the wafer dome to be positioned at varying distances from the evaporation source. However, none of them provides for centering a wafer dome over an evaporant source and additionally rotating and linearly moving the wafer dome with respect to the evaporant source. As a result, adjustments in the angle of incidence of the evaporant on the wafer surface are not accomplished. In large vacuum deposition systems having a plurality of sources, some of these sources may be offset from the center of the wafer dome by up to, or even more than, twelve degrees. The resulting thickness distribution across a batch of wafers is totally unacceptable for state of the art high density integrated circuits.

Vacuum deposition systems having a planetary drive for moving the wafer dome within the chamber are similarly unsuitable. Planetary drive systems generate particles within the vacuum system which end up on the wafers being deposited. Such particles can render the integrated circuit made from the batch of wafers undergoing a deposition within the planetary system inoperable. This particle generation problem becomes much more acute for state of the art integrated circuits with their associated smaller geometries. Another severe limitation of these planetary drive systems in that the angle of incidence between the source being evaporated and the semiconductor wafers can be as much as 12°. As a result, the thickness distribution across a batch of deposited wafers will be too wide. As previously indicated, this distribution problem increases as wafer diameters increase.

Accordingly, it is an object of this invention to provide an improved vacuum deposition system and apparatus.

It is another object of this invention to provide a vacuum deposition system wherein a workpiece, such as a semiconductor wafer may be rotated about an evaporant source, centered over the evaporant source, and moved at varying distances from the evaporant source.

It is yet a further object of this invention to provide a vacuum deposition system having multiple sources wherein the workpiece being deposited upon can be centered over a selected one of the plurality of sources.

DISCLOSURE OF THE INVENTION

This invention relates to an apparatus for depositing a uniform layer of material on a workpiece, such as a semiconductor wafer, within a vacuum environment. The vacuum deposition takes place within a vacuum chamber having one or more sources of material which may be deposited onto the semiconductor wafers. A batch of semiconductor wafers are affixed to a wafer dome during the deposition process. The wafer dome may be moved to varying distances from the source being evaporated and the wafer dome may also be rotated about the evaporated source. Additionally, the entire wafer dome is aligned with the source being evaporated.

A circular opening is provided in the top of the vacuum chamber. A drive shaft which is connected at one end to the wafer dome extends eccentrically with respect to the central axis of the chamber through this opening to the exterior of the vacuum chamber. The drive shaft continues through a rotary sealing assembly, a rotary-linear sealing actuator and is connected at the other end to a DC electric motor. A stainless steel support plate is welded to the top of the vacuum chamber. The support plate has a hole therein which is coincident with the opening in the vacuum chamber. The stainless steel support plate provides mechanical strength required to support the apparatus located exterior to the vacuum chamber for driving the wafer dome.

The rotary sealing assembly comprises three separate sections. The first section is an annular shaped mounting assembly which is bolted to the stainless steel support plate. A circular rotary sealing assembly mates with the mounting assembly to provide a vacuum tight seal. The circular rotary sealing assembly has an outwardly extending lip upon which is sealably mounted a stainless steel sealing plate. The stainless steel sealing plate has an aperture through which the drive shaft extends.

A rotary-linear sealing actuator is sealably bolted atop the stainless steel sealing plate about this aperture. The drive shaft extends through this rotary-linear sealing actuator to a DC electric motor. The rotary-linear sealing actuator provides a vacuum-tight seal around the drive shaft. The DC electric motor provides rotational movement to the drive shaft and thereby to the wafer dome. An air cylinder is mounted on the stainless steel sealing plate adjacent to the rotary-linear sealing actuator. The air cylinder has an air operable rod which engages a plate adjacent to the DC electric motor for inwardly and outwardly moving the motor in response to the movement of the rod. The air cylinder thus allows the wafer dome inside the vacuum chamber to be moved inwardly and outwardly.

Also connected to the stainless steel sealing plate is a gear drive which enables the stainless steel sealing plate and the rotary sealing assembly to rotate a full 360°. This 360° rotation allows the wafer dome, which is mounted on the drive shaft, to be eccentrically rotated around the inside of the vacuum chamber. The eccentric rotation is allowed by offset mounting the drive shaft with respect to the central longitudinal axis of the vacuum chamber. The gear drive is driven by a stepper motor which allows the entire rotary sealing assembly to be rotated incrementally.

BEST MODE FOR CARRYING OUT THE INVENTION

Figure 1:
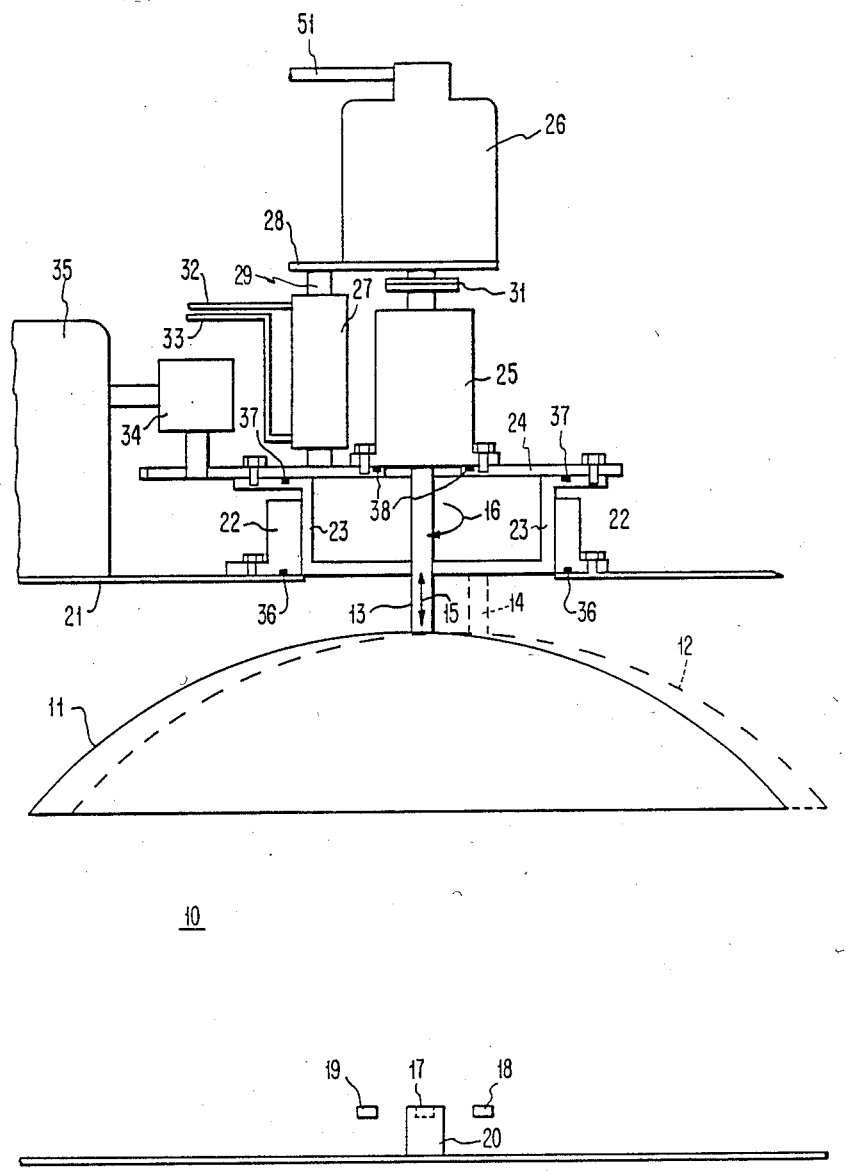
FIG. 1 is a partial section view of a vacuum deposition system including the apparatus for driving a wafer dome according to the present invention.

Referring to FIG. 1, evaporant sources 17-20 are located within vacuum chamber 10. The locations of sources 17 through 20, with respect to one another, is shown more clearly in FIG. 2. Wafer dome 11 is supported within chamber 10 by drive shaft 13. As indicated by arrows 15 and 16, drive shaft 13 and hence wafer dome 11 may be driven linearly, i.e., moved up and down, as well as rotated in place. One or more work pieces, such as a semiconductor wafer (not shown) are affixed to the underside of wafer dome 11. In this manner, evaporant from sources 17-20 may be deposited on these workpieces or wafers.

Drive shaft 13 and wafer dome 11, in addition to the motions indicated by arrows 15 and 16, may also be moved eccentrically within vacuum chamber 10. For example, dashed lines 12 represent a position that wafer dome 11 may be moved to when drive shaft 13 is eccentrically rotated to the position shown schematically by dashed lines 14. The details of this eccentric rotation will be presented hereinafter.

Stainless steel support plate 21 is welded to the top of vacuum chamber 10, thereby providing support for the apparatus used to move drive shaft 13 and dome 11. Opening 41 (see FIG. 2) is formed by coincident openings in chamber 10 and stainless steel support plate 21. Annular shaped mounting assembly 22 is bolted to stainless steel support plate 21 on the exterior of vacuum chamber 10. Circular shaped sealing assembly 23 mates with mounting assembly 22 to form a vacuum seal. O-rings 36 facilitate the vacuum seal between mounting assembly 22 and stainless steel support plate 21. Sealing assembly 23 is free to rotate over an entire 360° path within mounting assembly 22. A slot is provided in rotary sealing assembly 23 through which drive shaft 13 extends. This slot is offset with respect to the central longitudinal axes of both sealing assembly 23 and vacuum chamber 10. In order to provide the required eccentric rotation of the wafer dome 11, drive shaft 13 must be offset or eccentric with respect to the central longitudinal axes of both sealing assembly 23 and vacuum chamber 10. Sealing assembly 23 and vacuum chamber 10 may or may not have the same central longitudinal axis.

Stainless steel sealing plate 24 is bolted onto sealing assembly 23. O-rings 37 provide a vacuum-tight seal of sealing plate 24 to mounting assembly 23. Since sealing plate 24 is affixed to mounting assembly 23, the former rotates with the latter.

Rotary-linear sealing actuator 25 is sealably mounted on sealing plate 24 using O-rings 38. Drive shaft 13 extends through the entire length of rotary-linear sealing actuator 25. Drive shaft 13 terminates at DC electric motor 26. DC motor 26 enables shaft 13 and dome 11 to rotate in place about a selected one of sources 17-20. Single direction clutch 31 mounted about shaft 13 enables this rotary motion. The power to motor 26 is supplied via cable 51.

Air cylinder 27 is mounted on sealing plate 24 and imparts linear movement to drive shaft 13 and hence wafer dome 11. Rod 29 of air cylinder 27 engages with plate 28 which is connected to motor 26. Air lines 32 and 33 control the actuation of rod 29 into and out of air cylinder 27. When wafer dome 11 is desired to be raised within vacuum chamber 10, rod 29 extends out from air cylinder 27, pushing plate 28 and hence motor 26. This movement of motor 26 which is connected to drive shaft 13 raises wafer dome 11 within chamber 10. When wafer dome 11 is desired to be lowered in vacuum chamber 10, rod 29 is retracted back into air cylinder 27 causing motor 26 to drop. Since shaft 13 is connected to motor 26, this will also cause the wafer dome 11 to drop within chamber 10.

Gear drive 34, which is connected between stepping motor 35 and sealing plate 24, enables the rotation of sealing assembly 23 and sealing plate 24 within opening 41 of vacuum chamber 10. Stepping motor 35 in conjunction with gear drive 34 provides incremental rotary motion through a full 360° for sealing assembly 23 and sealing plate 24. As a result, wafer dome 11 may be moved in a full 360° path within chamber 10. Together with DC electric motor 26 and air cylinder 27, stepping motor 35 and gear drive 34 enable wafer dome 11 to be moved to any point along a 360° path within chamber 10, rotated in place about that point, and moved inwardly and outwardly within vacuum chamber 10 so as to be located at various distances from sources 17-20 in vacuum chamber 10.

The sealing of mounting assembly 22 to stainless steel plate 21, sealing plate 24 to sealing assembly 23, and rotary-linear sealing actuator 25 to stainless sealing plate 24 are all accomplished using ferrofluidic seals. As is well known, ferrofluidic seals use a non-wearing O-ring of magnetic fluid as a positive hermetic barrier. These seals have found wide application as exclusion seals preventing liquid, vapor, metallic and non-metallic contaminants from reaching machinery parts in applications such as digital disc drives, grinding spindles, and textile wind-up heads. The seal generates a series of high intensity magnetic fields which entrap magnetic liquid as a dynamic sealant. The magnetic liquid or ferrofluid is a colloidal suspension of magnetic particles in a carrier liquid. Since there is no seal wear, there are no seal particles produced to degrade the system.

In operation, workpieces, such as semiconductor wafers, are loaded into wafer dome 11 with the surfaces of the wafers on which the evaporant is to be deposited oriented towards sources 17-20. Using drive gear 34 and stepping motor 35, wafer dome 11 is then incrementally stepped so as to align the center of wafer dome 11 with the center of the particular source being evaporated. For example, if source 18 is to be evaporated onto the wafers, then wafer dome 11 is moved to a position indicated by dashed lines 12. As can be seen in FIG. 1, drive shaft 13 is now in line with source 18 as indicated by dashed lines 14 representing the new position of shaft 13. In the preferred embodiment disclosed herein, sources 17-20 are located along the perimeter of a circle within chamber 10. As a result, drive shaft 13, which is mounted offset with respect to the center of sealing assembly 23, will also follow this same circular path. By placing the center of wafer dome 11 over the source being evaporated, non-uniform deposition of evaporant from one of sources 17-20 across the wafers within wafer dome 11 is substantially eliminated.

Once wafer dome 11 has been centered over the source being evaporated, then air cylinder 27 may be actuated to move wafer dome 11 inwardly or outwardly within chamber 10. The location of wafer dome 11 at varying distances from sources 17-20 is required by the different rate at which evaporant may be produced from each of sources 17-20.

Figure 2:
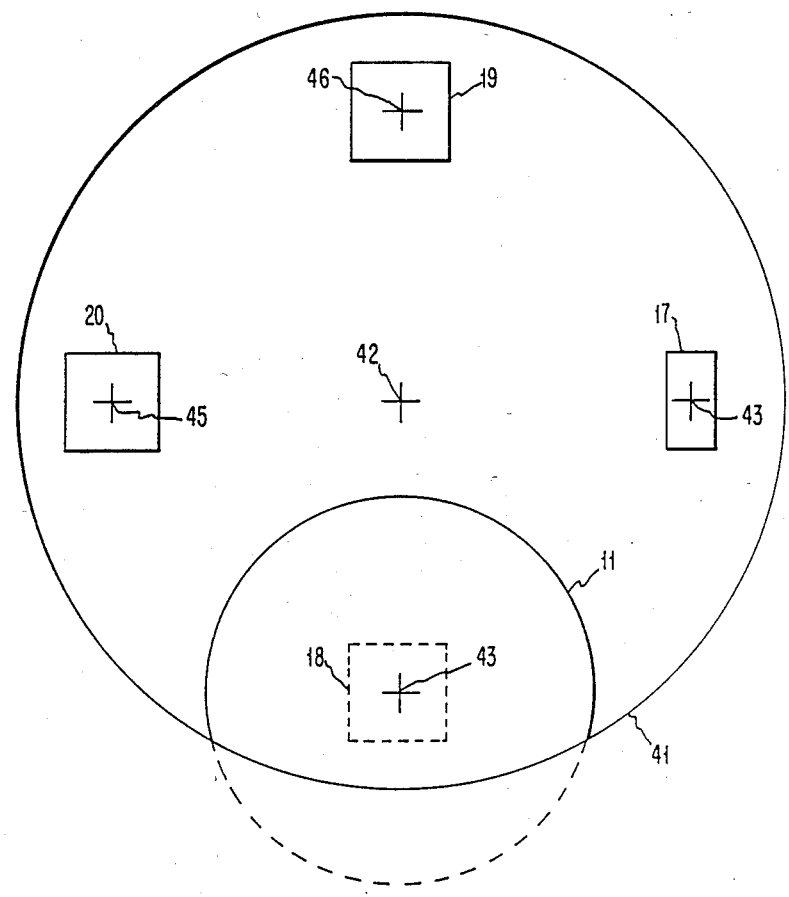
FIG. 2 is a top view looking down into a vacuum chamber through an opening in the chamber on which is mounted the driving apparatus of the present invention.

FIG. 2 more clearly shows the centering of wafer dome 11 over source 18. The center of source 18 is represented by the intersection of cross hairs at point 43. As can be seen, wafer dome 11 is centered over source 18. If instead one of sources 17, 19, or 20, where desired to be evaporated onto the semiconductor wafers, then wafer dome 11 would be moved so that the center of wafer dome 11 would be located over the center points 44, 46, or 45 of sources 17, 19, or 20, respectively. Point 42 is the center of opening 41 and also the center of sealing assembly 23. This shows more clearly the offset relationship of wafer dome 11 with respect to the center of opening 41 and sealing assembly 23.

After wafer dome 11 has been moved into alignment with the selected one of sources 17-20, and moved an appropriate distance from the selected one of sources 17-20, then wafer dome 11 is rotated in place at this location by DC motor 26. At this time, the evaporation of the selected one of sources 17-20 is begun.

If a multiple deposition process is required, vacuum chamber 10 need not be opened between depositions. For example, if after source 18 has been evaporated on the wafers affixed to dome 11, it is desired to deposit evaporant from source 19 onto the same wafers, then wafer dome 11 is moved into alignment with source 19. Then wafer dome 11 is moved to an appropriate distance from source 19 and the second deposition process is begun. As a result, multiple deposition processes can be carried out without the need for accessing vacuum chamber 10 as long as the desired evaporant source that is to be deposited on the semiconductor wafers is present within chamber 10.

While the invention has been particularly shown and described with reference to a preferred embodiment therein, it will be understood by those skilled in the art that the foregoing and other changes in form and detail will be made therein without departing from the spirit and scope of the invention.

What is claimed is:

1. Apparatus for moving a workpiece in a vacuum environment, comprising:

a vacuum chamber;

a workpiece holder suspended within the interior of said vacuum chamber for holding said workpiece;

an elongated member connected at one end thereof to said workpiece holder and extending eccentrically with respect to the central longitudinal axis of said vacuum chamber through an opening in said vacuum chamber;

first driving means external to said vacuum chamber and sealably coupled to said elongated member for eccentrically driving said workpiece holder within said vacuum chamber; and second driving means external to said vacuum chamber and connected to the other end of said elongated member for rotatively and linearly driving said workpiece holder within said vacuum chamber, said second driving means being sealably mounted on said first driving means, whereby said workpiece is moved eccentrically, linearly, and rotatively within said vacuum chamber without the generation of seal particles within said vacuum chamber.

2. Apparatus according to claim 1 wherein said first driving means is sealably mounted on the exterior of said vacuum chamber about said opening.

3. Apparatus according to claim 2 wherein said first driving means comprises a rotary sealing means having a slot for sealably receiving said elongated member therethrough.

4. Apparatus according to claim 3 wherein said rotary sealing means comprises a substantially annular mounting assembly affixed to the exterior of said vacuum chamber and a substantially circular rotatable sealing assembly, the interior surface of said mounting assembly mating with the exterior surface of said sealing assembly, thereby forming a vacuum tight seal, said rotary sealing means further including a sealing plate, mounted on and affixed to a lip on said sealing assembly for supporting said second driving means, said sealing plate having an aperture at one end of said slot, thereby enabling said elongated member to extend therethrough.

5. Apparatus according to claim 4 wherein said first driving means further comprises indexing means for rotating said sealing assembly, whereby said workpiece holder is rotated eccentrically within said vacuum chamber.

6. Apparatus according to claim 5 wherein said indexing means comprises a gear drive connected to said sealing plate for driving said sealing plate and said sealing asembly, whereby said workpiece holder and said elongated member are driven eccentrically.

7. Apparatus according to claim 6, wherein said indexing means further comprises:
a stepper motor coupled to said gear drive for stepping said gear drive in increments, whereby said workpiece holder and said elongated member are driven eccentrically in increments.

8. Apparatus according to claim 1 wherein
said first driving means is sealably mounted by means of a sealing plate; and
said second driving means comprises a rotary-linear sealing actuator mounted on said sealing plate and having a vacuum tight passage for passing said elongated member therethrough.

9. Apparatus according to claim 8 wherein said second driving means further comprises a motor connected to said other end of said elongated member for rotating said elongated member about its central longitudinal axis.

10. Apparatus according to claim 9 wherein said second driving means further comprises:
linear actuating means for imparting linear motion to said workpiece holder, said linear actuating means comprising a plate mounted about said elongated member adjacent to said motor, and an air cylinder mounted on said sealing plate and having an air actuated rod operable in a substantially parallel direction to said elongated member, said air actuated rod engaging said plate to linearly drive said motor, whereby said elongated member and said workpiece holder are moved linearly in a direction substantially parallel to the central longitudinal axis of said elongated member within said vacuum chamber.

11. Apparatus according to claim 10 further comprising a support plate having a hole coincident with said opening through which said elongated member passes, said support plate affixed to the exterior surface of said vacuum chamber for supporting said first and second driving means.

12. Apparatus for moving a workpiece in a vacuum environment, comprising:
a vacuum chamber;
a workpiece holder suspended within the interior of said vacuum chamber for holding said workpiece;
an elongated member connected at one end thereof to said workpiece holder and extending eccentrically with respect to the central longitudinal axis of said vacuum chamber through an opening in said vacuum chamber;
first driving means;
second driving means;
said first driving means sealably coupled by means of a slot to said elongated member for eccentrically driving said workpiece holder within said vacuum chamber and further comprising a substantially annular mounting assembly affixed to the exterior of said vacuum chamber, a substantially circular rotatable sealing assembly, the interior surface of said mounting assembly mating with the exterior surface of said sealing assembly, thereby forming a vacuum tight seal, and a sealing plate, mounted on and affixed to a lip on said sealing assembly for supporting said second driving means, said sealing plate having an aperture at one end of said slot, thereby enabling said elongated member to extend therethrough;
said second driving means connected to the other end of said elongated member for rotatively and linearly driving said workpiece holder within said vacuum chamber;
whereby said workpiece is moved eccentrically, linearly and rotatively within said vacuum chamber.

13. Apparatus according to claim 12 wherein said first driving means further comprises indexing means for rotating said sealing assembly, whereby said workpiece holder is rotated eccentrically within said vacuum chamber.

14. Apparatus according to claim 13 wherein said indexing means comprises a gear drive connected to said sealing plate for driving said sealing plate and said sealing assembly, whereby said workpiece holder and said elongated member are driven eccentrically.

15. Apparatus according to claim 14 wherein said indexing means further comprises a stepper motor coupled to said gear drive in increments, whereby said workpiece holder and said elongated member are driven eccentrically in increments.

16. Apparatus according to claim 12 wherein:
said second driving means comprises a rotary-linear sealing actuator mounted on said sealing plate and having a vacuum tight passage for passing said elongated member there through.

17. Apparatus according to claim 16 wherein said second driving means further comprises a motor connected to said other end of said elongated member for rotating said elongated member about its central longitudinal axis.

18. Apparatus according to claim 17 wherein said second driving means further comprises:
linear actuating means for imparting linear motion to said workpiece holder, said linear actuating means comprising a plate mounted about said elongated member adjacent to said motor, and an air cylinder mounted on said sealing plate and having an air actuated rod operable in a substantially parallel direction to said elongated member, said air actuated rod engaging said plate to linearly drive said motor, whereby said elongated member and said workpiece holder are moved linearly in a direction substantially parallel to the central longitudinal axis of said elongated member within said vacuum chamber.

19. Apparatus according to claim 18 further comprising a support plate having a hole coincident with said opening through which said elongated member passes, said support plate affixed to the exterior surface of said vacuum chamber for supporting said first and second driving means.

* * * * *